United States Patent
Kobayashi

(10) Patent No.: US 8,250,511 B2
(45) Date of Patent: Aug. 21, 2012

(54) DESIGNING APPARATUS, DESIGNING METHOD, AND DESIGNING PROGRAM FOR SEMICONDUCTOR INTEGRATED CIRCUIT

(75) Inventor: Susumu Kobayashi, Kanagawa (JP)

(73) Assignee: Renesas Electronics Corporation, Kawasaki-Shi, Kanagawa (JP)

( * ) Notice: Subject to any disclaimer, the term of this patent is extended or adjusted under 35 U.S.C. 154(b) by 295 days.

(21) Appl. No.: 12/588,283

(22) Filed: Oct. 9, 2009

(65) Prior Publication Data

US 2010/0107134 A1    Apr. 29, 2010

(30) Foreign Application Priority Data

Oct. 29, 2008    (JP) ................................. 2008-278825

(51) Int. Cl.
*G06F 17/50* (2006.01)

(52) U.S. Cl. ........ 716/122; 716/109; 716/115; 716/123; 716/129; 716/130; 716/133; 703/16

(58) Field of Classification Search .................. 716/109, 716/115, 122, 123, 129, 130, 133; 703/16
See application file for complete search history.

(56) References Cited

U.S. PATENT DOCUMENTS

| | | | | |
|---|---|---|---|---|
| 5,179,303 | A * | 1/1993 | Searles et al. | 327/277 |
| 5,703,798 | A * | 12/1997 | Dhar | 703/14 |
| 6,230,300 | B1 * | 5/2001 | Takano | 716/133 |
| 6,353,917 | B1 * | 3/2002 | Muddu et al. | 716/113 |
| 6,523,159 | B2 | 2/2003 | Bernstein et al. | |
| 6,687,888 | B2 * | 2/2004 | Chen | 716/113 |
| 6,728,941 | B2 * | 4/2004 | Chen | 716/136 |
| 6,785,870 | B2 * | 8/2004 | Chen | 716/113 |
| 6,975,978 | B1 * | 12/2005 | Ishida et al. | 703/15 |
| 7,203,914 | B2 * | 4/2007 | Wood | 716/113 |
| 7,245,516 | B2 | 7/2007 | Inoue | |
| 7,367,000 | B2 * | 4/2008 | Kurihara et al. | 716/115 |
| 7,930,652 | B2 * | 4/2011 | Wood | 716/113 |
| 2003/0177452 | A1 * | 9/2003 | Chen | 716/2 |
| 2003/0177459 | A1 * | 9/2003 | Chen | 716/5 |
| 2003/0177460 | A1 * | 9/2003 | Chen | 716/5 |
| 2005/0010883 | A1 * | 1/2005 | Wood | 716/6 |
| 2007/0044047 | A1 * | 2/2007 | Kurihara et al. | 716/2 |
| 2008/0215303 | A1 * | 9/2008 | Ogawa et al. | 703/14 |

FOREIGN PATENT DOCUMENTS

| | | |
|---|---|---|
| JP | 3800514 | 7/2006 |
| JP | 2007-142282 | 6/2007 |

* cited by examiner

*Primary Examiner* — Phallaka Kik
(74) *Attorney, Agent, or Firm* — McGinn IP Law Group, PLLC

(57) ABSTRACT

A designing apparatus includes an initial estimating portion, a general power supply noise analyzing portion, a layout designing portion, a detail estimating portion, a detail power supply noise analyzing portion, and a layout adjusting portion. The initial estimating portion estimates general values of an entire consumed current and an entire on-chip capacitance. Based on the estimated general values, the general power supply noise analyzing portion creates a lumped constant circuit model so as to conduct a power supply noise analysis, for computing a current-capacitance ratio. Based on the current-capacitance ratio, the layout designing portion performs placement of cells for each of predetermined regions obtained by dividing a placement region. The detail estimating portion creates a lumped constant circuit model for each of the predetermined regions so as to estimate detail values of the consumed current and the on-chip capacitance for each of the predetermined regions. Based on the detail values, the detail power supply noise analyzing portion conducts a detail power supply noise analysis. Based on a result of the detail power supply noise analysis, the layout adjusting portion performs adjustment of the placement of the cells.

19 Claims, 5 Drawing Sheets

US 8,250,511 B2

DESIGNING APPARATUS, DESIGNING METHOD, AND DESIGNING PROGRAM FOR SEMICONDUCTOR INTEGRATED CIRCUIT

BACKGROUND OF THE INVENTION

1. Field of the Invention

The present invention relates to a designing apparatus, a designing method, and a designing program for a semiconductor integrated circuit.

2. Description of the Related Art

Many designing methods for semiconductor integrated circuits are known. For instance, Japanese Patent Application Laid-Open No. 2007-142282 and Japanese Patent No. 3800514 disclose technologies for placement of decoupling capacitance.

Japanese Patent Application Laid-Open No. 2007-142282 discloses a layout method for an integrated circuit in which a plurality of cells are placed. This layout method for an integrated circuit includes the steps of computing a value of decoupling capacitance, creating a virtual cell, placing the virtual cell, and placing the decoupling capacitance. The step of computing a value of the decoupling capacitance includes computing values of decoupling capacitance that are necessary for individual functional cells. The step of creating a virtual cell includes creating the virtual cell having a placement region that is necessary for placement of the decoupling capacitance of the computed value and the functional cell. When the virtual cell is placed, the decoupling capacitance is placed in the placement region of the virtual cell in the step of placing the decoupling capacitance.

In this method, capacitance characterized for each type of the cell is set in advance. In other words, the necessary decoupling capacitance is computed assuming that every circuit works in one clock period. Therefore, the decoupling capacitance cell becomes excessive so that a chip size or leakage power may increase.

Japanese Patent No. 3800514 discloses a method for adding decoupling capacitance in designing an integrated circuit. This method makes a computer execute the following ten steps:

1) the step of creating a plan view concerning the integrated circuit, the plan view including a macro having requirements of predetermined functional characteristics and the decoupling capacitance space;
2) the step of dividing the plan view into a plurality of regions;
3) the step of determining an intrinsic capacitance value for each region;
4) the step of determining a support decoupling capacitance value necessary for supporting power grid voltage of each region in the plan view;
5) the step of determining a necessary decoupling capacitance value for each region based on the support decoupling capacitance value and the intrinsic capacitance value;
6) the step of determining a decoupling capacitor area for each region with respect to the necessary decoupling capacitance value;
7) the step of deciding whether or not the integrated circuit is a type in which the decoupling capacitance should be added in a vacant region;
8) the step of reducing the area that can be used for a circuit in each region by an amount corresponding to the decoupling capacitor area necessary in the region if it is decided that the integrated circuit is not the type in which the decoupling capacitance should be added in a vacant region;
9) the step of creating a rule of a reduced circuit layout for each region; and
10) the step of correcting the plan view based on the rule.

This method estimates the decoupling capacitance necessary for each region when the layout is designed. Therefore, the decoupling capacitance cells of the entire chip may not fall within the chip size so that substantial backtracking of design may be caused, resulting in an increase of designing cost. In addition, if a sufficient space for the decoupling capacitance is secured in advance in an early stage of design, the backtracking of design is reduced, but the chip size may be increased excessively. As a result, manufacturing cost may increase.

SUMMARY

It is an object of the present invention to provide a designing apparatus, a designing method, and a designing program for a semiconductor integrated circuit, which can efficiently place decoupling capacitance necessary for controlling power supply noise to be within a predetermined tolerance.

Hereinafter, means for solving problems is described using reference numerals and signs that are used in "DETAILED DESCRIPTION OF THE PREFERRED EMBODIMENTS". These numerals and signs are used for clarifying correspondences between "WHAT IS CLAIMED IS" and "DETAILED DESCRIPTION OF THE PREFERRED EMBODIMENTS". However, the numerals and signs should not be used for interpreting the technical scope of the invention recited in "WHAT IS CLAIMED IS".

According to an aspect of the present invention, the designing apparatus for a semiconductor integrated circuit includes an initial estimating portion (21), a general power supply noise analyzing portion (22), a layout designing portion (24), a detail estimating portion (26), a detail power supply noise analyzing portion (27), and a layout adjusting portion (29). The initial estimating portion (21) estimates general values of consumed current and on-chip capacitance of an entire semiconductor integrated circuit to be designed for placement. Based on the estimated general values, the general power supply noise analyzing portion (22) creates a lumped constant circuit model of the semiconductor integrated circuit so as to conduct a power supply noise analysis, for computing a current-capacitance ratio that is a ratio of the consumed current to the on-chip capacitance. Based on the current-capacitance ratio, the layout designing portion (24) performs placement of a primitive cell and a decoupling capacitance cell for each of predetermined regions obtained by dividing a placement region of the semiconductor integrated circuit. Based on a result of the placement, the detail estimating portion (26) creates a lumped constant circuit model for each of the predetermined regions so as to estimate detail values of the consumed current and the on-chip capacitance for each of the predetermined regions. Based on the detail values, the detail power supply noise analyzing portion (27) conducts a detail power supply noise analysis. Based on a result of the detail power supply noise analysis, the layout adjusting portion (29) performs adjustment of the placement of the primitive cell and the decoupling capacitance cell.

According to another aspect of the present invention, the designing method for a semiconductor integrated circuit, which is a method executed by a computer, includes: estimating a general value, conducting a power supply noise analysis, setting a total amount of on-chip capacitance, computing a current-capacitance ratio, performing placement, estimating a detail value, conducting a detail power supply noise analysis, and performing adjustment of the placement. The estimating a general value includes estimating general values of consumed current and on-chip capacitance of an entire semiconductor integrated circuit to be designed for placement. The conducting a power supply noise analysis includes creating a lumped constant circuit model of the semiconductor integrated circuit based on the estimated general values so as to conduct the power supply noise analysis. The setting a total amount of the on-chip capacitance includes setting the total amount of the on-chip capacitance based on a result of the power supply noise analysis so that the power supply noise becomes a value within a predetermined range. The computing a current-capacitance ratio includes computing the current-capacitance ratio that is a ratio of the consumed current to the on-chip capacitance based on the estimated general values and the total amount of the set on-chip capacitance. The performing placement includes performing the placement of the primitive cell and the decoupling capacitance cell for each of the predetermined regions obtained by dividing the semiconductor integrated circuit based on the current-capacitance ratio. The estimating a detail value includes creating a lumped constant circuit model for each of the predetermined regions based on a result of the placement so as to estimate detail values of the consumed current and the on-chip capacitance of each of the predetermined regions. The conducting a detail power supply noise analysis includes conducting the detail power supply noise analysis based on the detail values. The performing adjustment of the placement includes performing the adjustment of the placement of the primitive cell and the decoupling capacitance cell based on a result of the detail power supply noise analysis.

According to the present invention, it is possible to provide the designing apparatus, the designing method, and the designing program for the semiconductor integrated circuit, which can efficiently place decoupling capacitance necessary for controlling power supply noise to be within a predetermined tolerance.

DETAILED DESCRIPTION OF THE PREFERRED EMBODIMENTS

Figure 1:
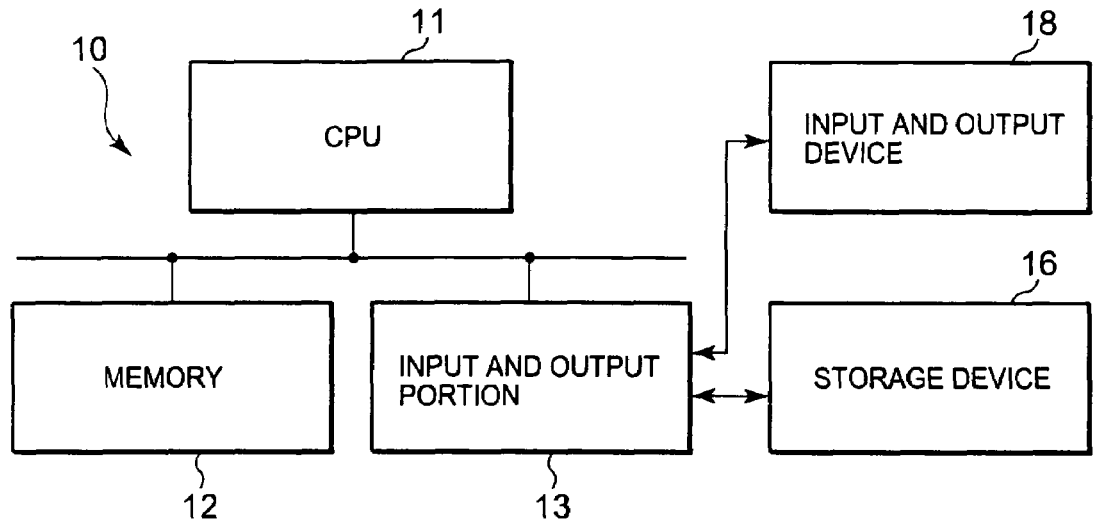
FIG. 1 is a diagram illustrating a structure of a designing apparatus according to an embodiment of the present invention.

Now, a preferred embodiment for carrying out the present invention is described with reference to the attached drawings. FIG. 1 is a diagram illustrating structure of a designing apparatus according to an embodiment of the present invention. A designing apparatus 10 is a so-called computer including a central processing unit (CPU) 11, a memory 12, an input and output portion 13, a storage device 16, and an input and output device 18. In this embodiment, functions of the designing apparatus according to the present invention are realized by the computer executing a program. A part or the whole of the functions may be realized by a dedicated apparatus.

Figure 2:
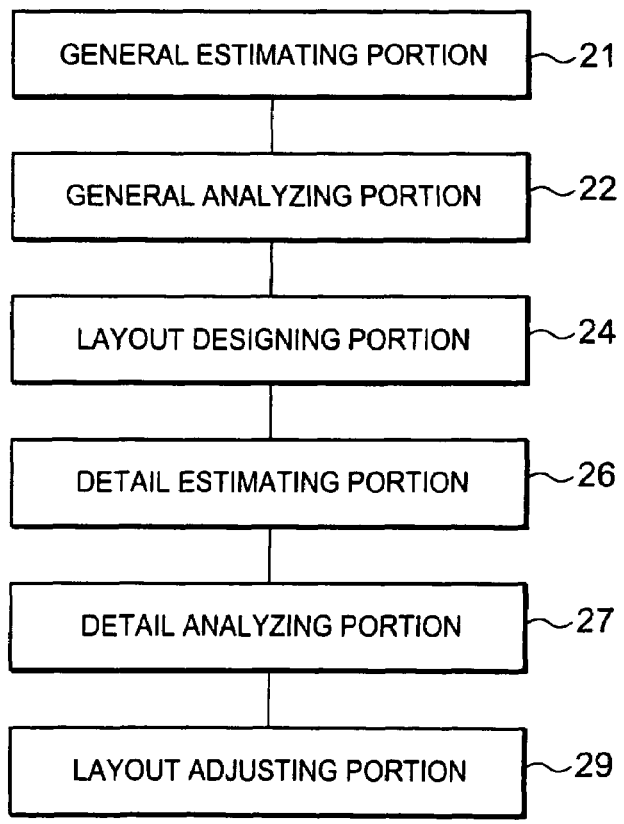
FIG. 2 is a diagram illustrating a functional structure of the designing apparatus according to the embodiment of the present invention.

The designing apparatus 10 is a layout designing apparatus that is used at an early designing stage after finishing a floor plan stage. As illustrated in FIG. 2, the designing apparatus 10 includes a general estimating portion 21, a general analyzing portion 22, a layout designing portion 24, a detail estimating portion 26, a detail analyzing portion 27, and a layout adjusting portion 29, which constitute a functional configuration.

The general estimating portion 21 estimates consumed current and on-chip capacitance at the early designing stage. The consumed current is current consumed in one clock period and can be estimated by a circuit simulation. The on-chip capacitance is a capacitance component between the power supply line and the ground line on a chip of a large scale integrated circuit (LSI) and can be estimated from a typical capacitance value. For instance, the on-chip capacitance can be estimated by multiplying a typical capacitance value per unit area in a process of the LSI to be designed by a chip size. Alternatively, the on-chip capacitance can be estimated by approximating static circuit capacitance values, wiring capacitance values, and well capacitance values of individual functional blocks based on a circuit design information and by summing up the capacitance values.

Figure 3:
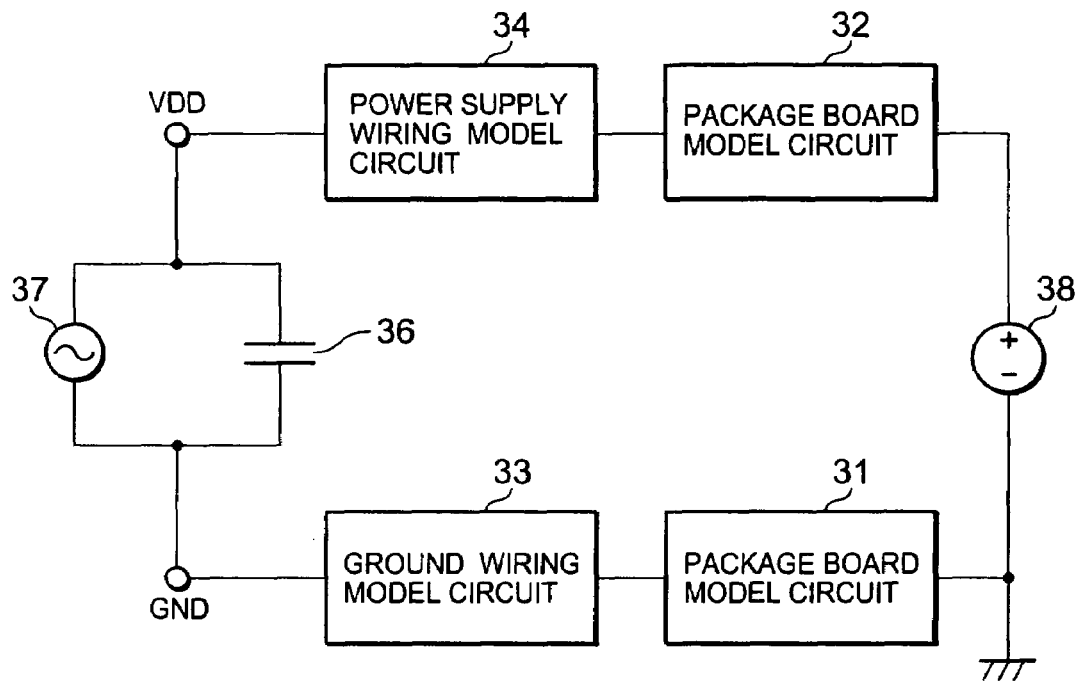
FIG. 3 is a diagram illustrating a lumped constant circuit model for conducting a power supply noise analysis of a large scale integrated circuit (LSI)

The general analyzing portion 22 conducts the power supply noise analysis based on the consumed current and the on-chip capacitance estimated by the general estimating portion 21, by using the lumped constant circuit model as illustrated in FIG. 3. In other words, the general analyzing portion 22 approximates global peak noise of the entire chip. Here, the power supply noise is noise superimposed on the power supply voltage and is evaluated as a peak-to-peak voltage value of the noise component.

As illustrated in FIG. 3, the lumped constant circuit model includes package board model circuits 31 and 32, a ground wiring model circuit 33, a power supply wiring model circuit 34, on-chip capacitance 36, and a noise current source 37. The lumped constant circuit model is supplied with power supply voltage from a voltage source 38.

Figure 4:
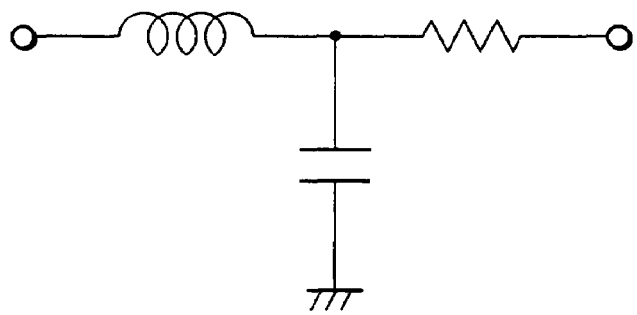
FIG. 4 is a diagram illustrating a package board model circuit.

The package board model circuits 31 and 32 create an LCR circuit model of a power supply terminal and a ground terminal for connecting the inside with the outside of the chip, a package type, and the like as illustrated in FIG. 4.

Figure 5:
FIG. 5 is a diagram illustrating a model circuit of power supply wiring and ground wiring.

The on-chip ground wiring model circuit 33 and the on-chip power supply wiring model circuit 34 create a resistance circuit model of the ground wiring and the power supply wiring as illustrated in FIG. 5. The ground wiring model circuit 33 and the power supply wiring model circuit 34 are inserted for suppressing undesired oscillation in the simulation. However, the resistance value usually does not affect the peak noise so much, and hence a standard resistance value is used for the resistance model circuit.

Figure 6A:
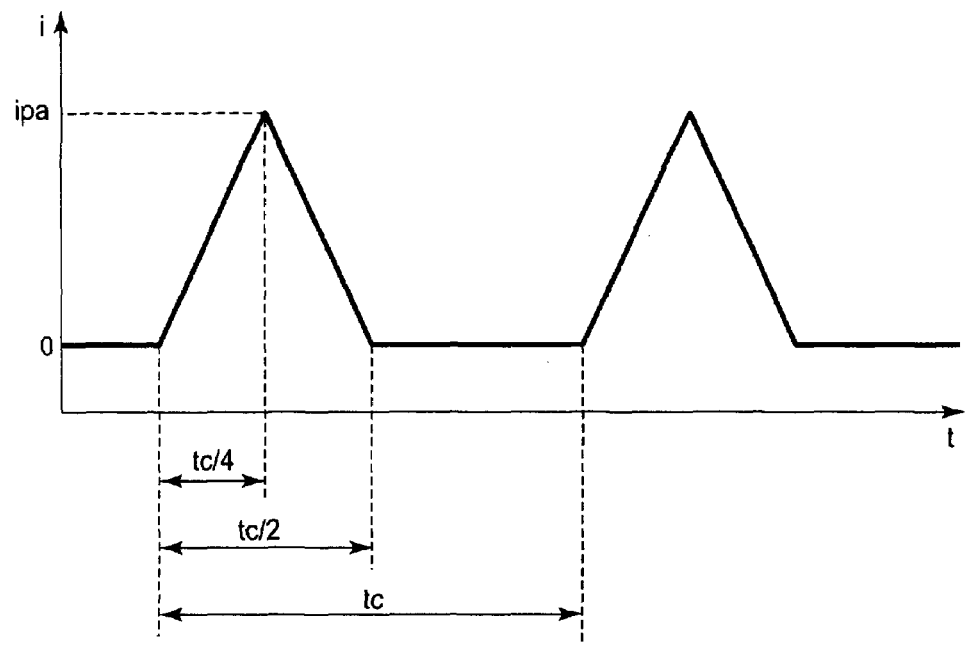
FIG. 6A is a diagram illustrating a current waveform of a noise current source.
Figure 6B:
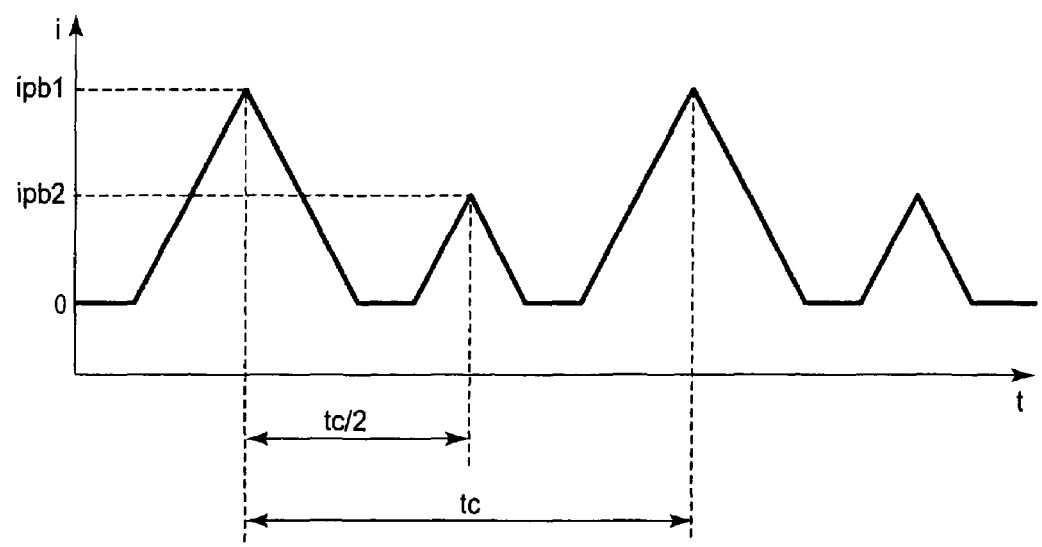
FIG. 6B is a diagram illustrating a current waveform of a noise current source.

The on-chip capacitance estimated by the general estimating portion 21 is shown as a model of the aggregated on-chip capacitance 34. In addition, based on the consumed current estimated by the general estimating portion 21, a noise current source 35 in the lumped constant circuit model is set. The current supplied from the noise current source 35 has a triangular current waveform, for example, as illustrated in FIG. 6A. A peak current value of this waveform is set so that the integral value of current per one clock period is equal to the estimated consumed current value. Here, the current flows for a period tc/2 that is a half of a clock period tc. The current increases for a period tc/4 that is a half of the period while the current flows, and the current decreases in the other half period tc/4. Therefore, a peak value ipa of the consumed current in this case is four times the average current. Alternatively, as illustrated in FIG. 6B, the current waveform may have two peaks in one clock period. In this case, a peak (ipb1) having a high current value is synchronous with the leading edge (or the trailing edge) of the clock signal, while a peak (ipb2) having a low current value is synchronous with the trailing edge (or the leading edge) of the clock signal. This simulates that the circuit in the chip works in synchronization with the clock signal.

The noise analysis is carried out based on the lumped constant circuit model set as described above. According to this analysis, if the noise due to power supply resonance is large, a package type, the number of power supply terminals, the number of ground terminals, and the on-chip capacitance are changed so as to suppress the resonance. If the package type is changed, the power supply wiring model circuit 34 and the ground wiring model circuit 33 are mainly changed. If the number of power supply terminals and the number of ground terminals are changed, the package board model circuits 31 and 32 are mainly changed. After that, if the peak noise exceeds a preset tolerance, a capacitance value of the on-chip capacitance 34 is increased or decreased, and hence the peak noise is adjusted to be an appropriate value within the tolerance.

The above-mentioned noise analysis is repeated for adjustment. As a result, the package type, the number of power supply terminals, the number of ground terminals, and the capacitance value of the on-chip capacitance 34 are determined. The decoupling capacitance necessary for suppressing the noise is determined by subtracting the estimated on-chip capacitance value from the capacitance value of the on-chip capacitance 34. Therefore, the chip size is determined so as to be capable of accommodating the decoupling capacitance necessary for suppressing the noise. The noise analysis is carried out based on the lumped constant circuit model, and hence the number of parameters to be adjusted is small and the noise analysis can be repeated easily.

Here, the ratio of the consumed current to the capacitance value of the on-chip capacitance 34, i.e., the current-capacitance ratio is computed. This current-capacitance ratio is used for the layout design to be described later. As described later in detail, if the circuit layout is made in the layout design so that the current-capacitance ratio in each local region within the chip becomes sufficiently close to the value computed here, local peak noise within the chip becomes substantially equal to the peak noise computed here.

Figure 7:
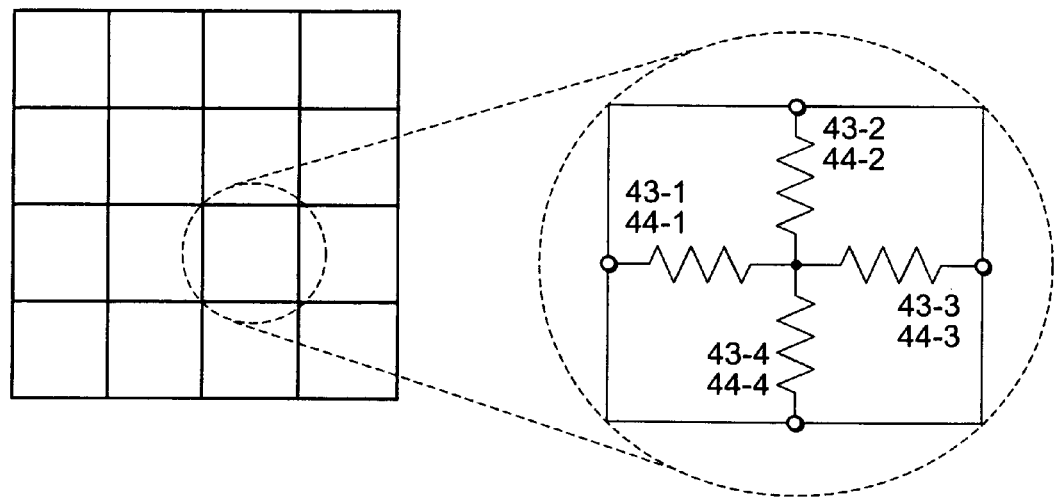
FIG. 7 is a diagram illustrating a layout plane of a chip that is divided into regions.

The layout designing portion 24 performs the placement of primitive cells (general cells) and decoupling capacitance cells. The layout plane of the chip is divided into regions, for example, as illustrated in FIG. 7. Based on the placed primitive cells, the consumed current value is computed for each region. The decoupling capacitance is determined based on the consumed current value and the current-capacitance ratio, and the decoupling capacitance cell having a size of the determined decoupling capacitance is placed in the region. If the decoupling capacitance cell cannot be accommodated in the region, relocation of the primitive cells is carried out. In other words, an occupancy area of the primitive cells is changed by the relocation of the primitive cells. Alternatively, the consumed current value is changed so that the decoupling capacitance computed based on the current-capacitance ratio is changed. The decoupling capacitance cells and the primitive cells that can be accommodated in the region are placed.

As a specific placement method, for example, there is a mini cut method that is a usual placement method, in which a balance between the estimated consumed current value of each divided region and the space occupied by the decoupling capacitance cells is checked every time when the circuit division (region division) is carried out. The circuit division is adjusted so that the current-capacitance ratio in the divided region becomes sufficiently close to the value determined by the general analyzing portion 22. The total amount of the consumed current values is not changed even after the division into regions. In addition, the total amount of the on-chip capacitance (decoupling capacitance) determined by the current-capacitance ratio is not changed. Therefore, the chip size is not changed.

Figure 8:
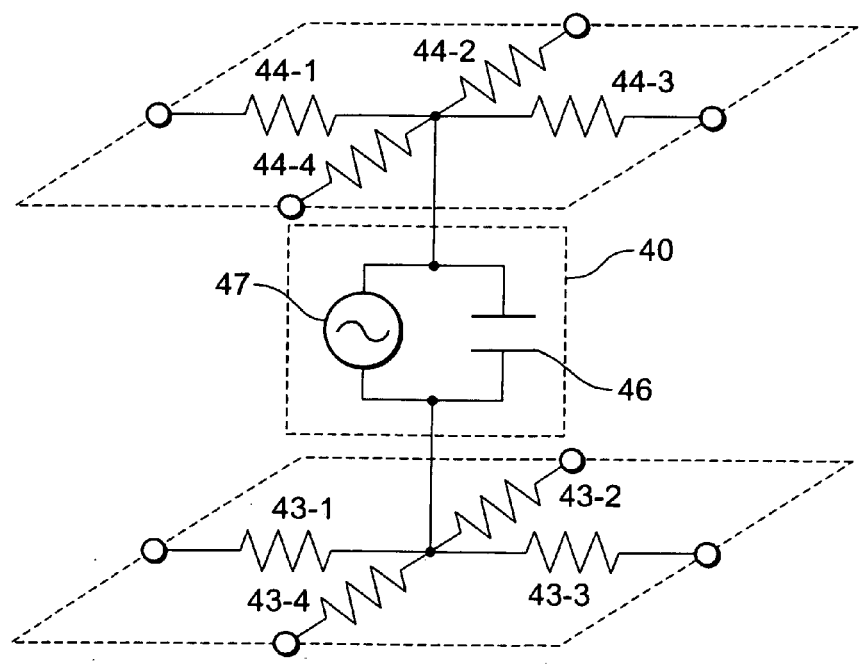
FIG. 8 is a diagram illustrating a lumped constant circuit model of each region.

The detail estimating portion 26 performs the detail estimation of the consumed current and the capacitance based on the chip layout after the layout design. In other words, the consumed current and the capacitance that are to be necessary for the detail analyzing portion 27 are computed. Here, for each divided region illustrated in FIG. 7, the consumed current value, the on-chip capacitance value, and resistance values of the ground and the wiring models in the lumped constant circuit model of the region are estimated based on the primitive cells included in the region. In each region, the ground wiring is converted into a model of resistors 43-1 to 43-4, and the power supply wiring is converted into a model of resistors 44-1 to 44-4. In other words, as illustrated in FIG. 8, the lumped constant circuit model of each region includes the resistors 43-1 to 43-4 as the ground wiring model circuit, the resistors 44-1 to 44-4 as the power supply wiring model circuit, on-chip capacitance 46, and a noise current source 47. The on-chip capacitance 46 and the noise current source 47 are connected in parallel so as to constitute the noise source 40, which is connected between the connection node of the resistors 43-1 to 43-4 and the connection node of the resistors 44-1 to 44-4. The current value of the noise current source 47 is set based on the consumed current of the primitive cells placed in the section. The waveform thereof is set similarly to the waveform in the general analyzing portion 22. Here, the waveform may be the triangular one as illustrated in FIG. 6A.

Figure 9:
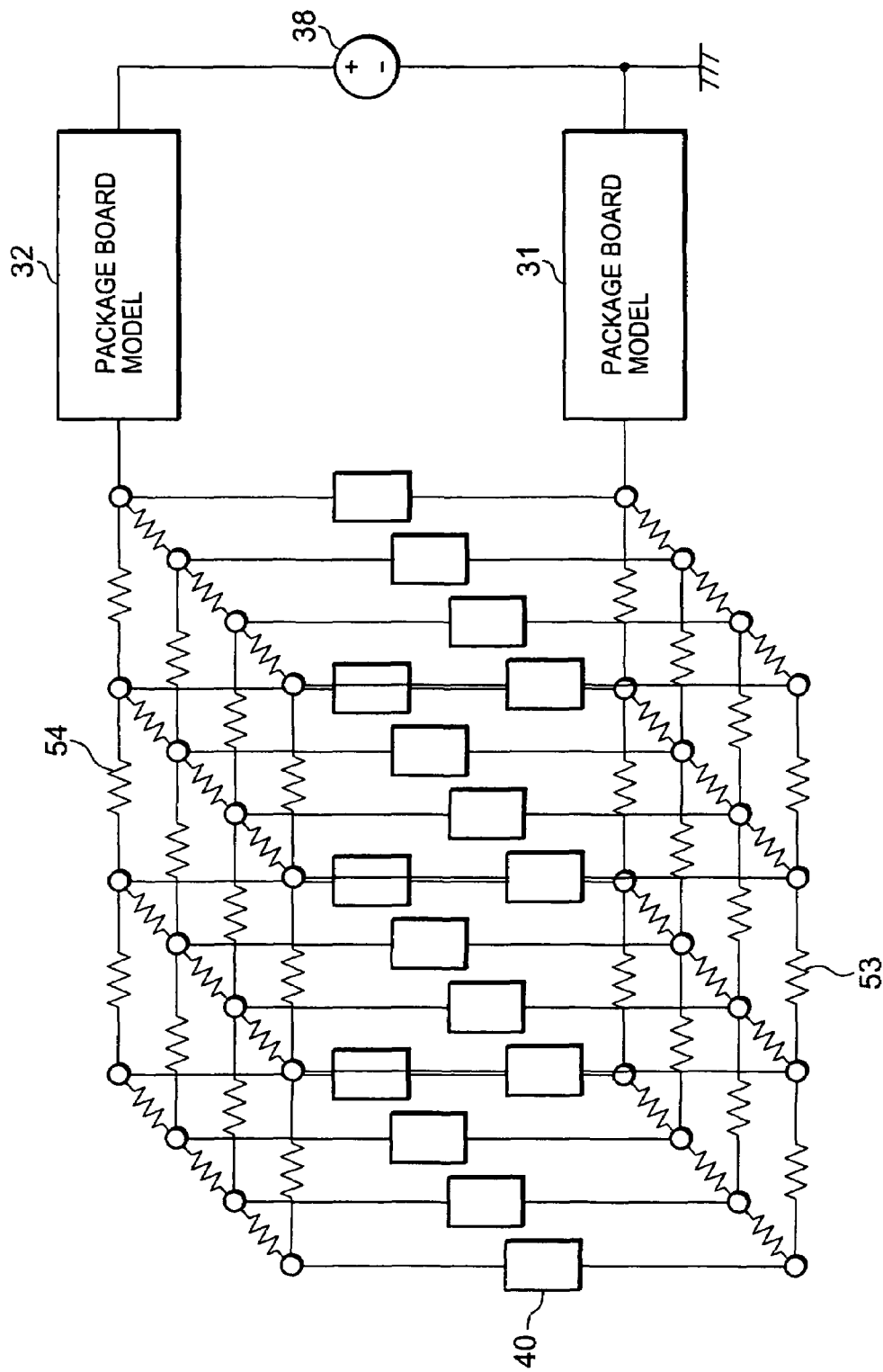
FIG. 9 is a diagram illustrating an analysis model for conducting a detail power supply noise analysis.

The detail analyzing portion 27 creates an analysis model of the LSI based on the detail model of the consumed current and the capacitance estimated by the detail estimating portion 26, the ground wiring, and the power supply wiring as illustrated in FIG. 9, so as to conduct the detail power supply noise analysis.

Here, the ground wiring model circuit is illustrated as a network of a resistor 53 that is illustrated as a combination of the resistors 43-1 to 43-4 indicating the ground wiring in each region and the resistors 43-1 to 43-4 indicating the ground wiring in the neighboring region. Similarly, the power supply wiring model circuit is illustrated as a network of a resistor 54 that is illustrated as a combination of the resistors 44-1 to 44-4 indicating the power supply wiring in each region and the resistors 44-1 to 44-4 indicating the power supply wiring in the neighboring region.

Further, in FIG. 9, each of the package board model circuits 31 and 32 is illustrated as a single circuit and is connected to the region where each of the package board model circuits 31 and 32 is placed for each of power supply pads and ground pads to which the voltage is supplied. In addition, the noise source 40 has a current value and a capacitance value that are different between individual regions as estimated by the detail estimating portion 26. Based on such the analysis model, the detail power supply noise analysis is carried out.

The layout adjusting portion 29 performs correction of the layout based on a result of the detail power supply noise analysis if there is apart in which the peak noise exceeds the tolerance. For instance, the correction is performed so that the decoupling capacitance is added or the layout thereof is changed.

In this way, the peak noise is controlled to be within the tolerance, and the layout design of the LSI is finished. Note that the region may be further divided so that the detail estimating portion 26 and the detail analyzing portion 27 conduct the detail power supply noise analysis. The above description is individually given for each function, but FIG. 2 can also be viewed as a flowchart of the program that realizes the individual functions.

In this way, at an early stage of the layout design, the lumped constant circuit model is used for conducting an abbreviated power supply noise analysis, and the decoupling capacitance necessary for suppressing the power supply noise is computed. In other words, a total amount of the decoupling capacitance necessary for controlling the peak noise to be within a tolerance is computed. When the lumped constant circuit model is used, it becomes easy to conduct a power supply resonance analysis, a decoupling capacitance examination, and a package examination. Based on a result of this abbreviated analysis of the power supply noise, the current-capacitance ratio that is a ratio between the consumed current in the entire chip and the on-chip capacitance is computed. The layout design after that is performed based on the current-capacitance ratio as an indicator.

In the layout design after that, the chip layout plane is divided into a plurality of regions. In each region, the placement of the primitive cells and the decoupling capacitance cells is performed so that the current-capacitance ratio becomes equal to the value of the above-mentioned indicator. When the placement design is performed with the current-capacitance ratio as the indicator, efficient design with little backtracking of the steps can be realized.

When the decoupling capacitance that is characterized for each cell is set, the decoupling capacitance necessary for each cell to work is set. As a result, the decoupling capacitance necessary for all the circuits to work in one clock period is computed. Therefore, the capacitance cells may be excessive. According to the present invention, the decoupling capacitance is set in accordance with the consumed current obtained by approximation of the actual circuit operation. Therefore, a necessary capacitance value can be smaller than that in the method of setting the decoupling capacitance characterized for each cell. As a result, a chip size and leakage power can be reduced.

In addition, when the decoupling capacitance necessary for each region is estimated while the layout design is carried out, the decoupling capacitance cells of the entire chip may not be accommodated in the chip size. In this case, a large backtracking may occur in the designing step, resulting in an increase of designing cost. According to the present invention, the necessary decoupling capacitance is estimated at an early designing stage, and then the chip size is determined based on a result of the estimation. Therefore, a space for the decoupling capacitance is secured in the layout design, and hence the backtracking of the design step can be reduced. Note that if the space for the decoupling capacitance is sufficiently secured in advance at the early designing stage, the backtracking of the design step is reduced, but the chip size may become excessive and manufacturing cost may be increased. According to the present invention, necessary and sufficient decoupling capacitance is estimated at the early designing stage, and hence there is little waste in the chip size, and the manufacturing cost can be reduced.

Further, according to the present invention, necessary and sufficient decoupling capacitance is placed for suppressing the power supply noise in each local region in the layout design. Therefore, it can be avoided that the decoupling capacitance cells are placed excessively and that the leakage power increases.

The current-capacitance ratio that is computed as a result of the abbreviated power supply noise analysis can be used for any size of the region. Therefore, when the current-capacitance ratio is used as the indicator for designing, the decoupling capacitance design can be carried out based on the indicator that is consistent over individual hierarchical levels in a hierarchical design in which a definition level of the design is increased step by step. Therefore, the efficient design can be carried out without a large backtracking.

What is claimed is:

1. A designing apparatus for a semiconductor integrated circuit, the designing apparatus comprising:
    an initial estimating portion for estimating general values of consumed current and on-chip capacitance of the semiconductor integrated circuit to be designed for placement;
    a general power supply noise analyzing portion for conducting a power supply noise analysis of the semiconductor integrated circuit as a lumped constant circuit model created based on the estimated general values, setting a total amount of on-chip capacitance so that a power supply noise becomes a value within a predetermined range, and computing a current-capacitance ratio indicating a ratio of the consumed current to the on-chip capacitance based on the estimated general values and the total amount of on-chip capacitance;
    a layout designing portion for performing placements of a primitive cell and a decoupling capacitance cell in each predetermined region of a plurality of predetermined regions obtained by dividing a placement region of the semiconductor integrated circuit, based on the current-capacitance ratio;
    a detail estimating portion for estimating detail values of the consumed current and the on-chip capacitance of each of the predetermined regions by creating a lumped constant circuit model of each of the predetermined regions, based on a result of the placements of the primitive cell and the decoupling capacitance cell;
    a detail power supply noise analyzing portion for conducting a detail power supply noise analysis based on the estimated detail values; and
    a layout adjusting portion for performing an adjustment of the placements of the primitive cell and the decoupling capacitance cell based on a result of the detail power supply noise analysis.

2. A designing apparatus for a semiconductor integrated circuit according to claim 1, wherein the initial estimating portion estimates an, entire consumed current as current consumed in one clock period, and
    wherein the detail estimating portion estimates the consumed current of each of the predetermined regions as current consumed in one clock period.

3. A designing apparatus for a semiconductor integrated circuit according to claim 1, wherein the layout designing portion computes a sum of current values of the primitive cells included in each of the predetermined regions, determines a decoupling capacitance based on the current-capacitance ratio and the sum of current values, determines a size of the decoupling capacitance cell having the decoupling capacitance, and performs relocation of the primitive cells among the predetermined regions, if the decoupling capacitance cell having the determined size cannot be accommodated in a corresponding one of the predetermined regions.

4. A designing apparatus for a semiconductor integrated circuit according to claim 3, wherein, before the placement region of the semiconductor integrated circuit is divided, the decoupling capacitance comprises a first value, and after the placement region of the semiconductor integrated circuit is divided, the decoupling capacitance comprises the first value.

5. A designing apparatus for a semiconductor integrated circuit according to claim 1, wherein the lumped constant circuit model of the semiconductor integrated circuit includes:
- a lumped capacitor that simulates the on-chip capacitance of the semiconductor integrated circuit;
- a lumped current source that simulates a power supply current flowing in the semiconductor integrated circuit;
- a wiring model that simulates wirings connected to the lumped current source; and
- a package board model that simulates a power supply terminal and a ground terminal of the semiconductor integrated circuit.

6. A designing apparatus for a semiconductor integrated circuit according to claim 5, wherein a waveform of a current value supplied from the lumped current source has a peak that is synchronous with a clock signal for operating the semiconductor integrated circuit.

7. A designing apparatus for a semiconductor integrated circuit according to claim 5, wherein a waveform of a current value supplied from the lumped current source comprises:
- a first peak that is synchronous with one of a leading edge and a trailing edge of a clock signal for operating the semiconductor integrated circuit; and
- a second peak that is lower than the first peak and is synchronous with another one of the leading edge and the trailing edge of the clock signal.

8. A designing apparatus for a semiconductor integrated circuit according to claim 1, wherein the lumped constant circuit model of each of the predetermined regions includes:
- a regional current source that simulates the current consumed by the primitive cell included in the predetermined region;
- a regional capacitor that simulates the on-chip capacitance distributed in the predetermined region; and
- a resistor that simulates resistance of a wiring connected to a region neighboring the predetermined region,
- wherein the semiconductor integrated circuit is modeled by a network to which the lumped constant circuit model of each of the predetermined regions is connected, and a package board model that simulates a power supply terminal and a ground terminal connected to the predetermined region.

9. A designing apparatus for a semiconductor integrated circuit according to claim 1, wherein the initial estimating portion estimates an entire consumed current as current consumed in one clock period.

10. A designing apparatus for a semiconductor integrated circuit according to claim 1, wherein the initial estimating portion approximates a global peak noise of the semiconductor integrated circuit.

11. A designing apparatus for a semiconductor integrated circuit according to claim 1, wherein, before the placement region of the semiconductor integrated circuit is divided, the consumed current comprises a first value, and after the placement region of the semiconductor integrated circuit is divided, the consumed current comprises the first value.

12. A designing apparatus for a semiconductor integrated circuit according to claim 1, wherein the layout designing portion places the primitive cell and the decoupling capacitance cell in each of the predetermined regions, so that the current-capacitance ratio is approximately equal to the ratio of the consumed current to the on-chip capacitance computed by the general power supply noise analyzing portion.

13. A designing method for a semiconductor integrated circuit, the designing method being executed by a processor on a computer and comprising:
- estimating general values of consumed current and on-chip capacitance of the semiconductor integrated circuit to be designed for placement;
- conducting a power supply noise analysis of the semiconductor integrated circuit by creating a lumped constant circuit model based on the estimated general values;
- setting a total amount of the on-chip capacitance so that a power supply noise becomes a value within a predetermined range, based on a result of the power supply noise analysis;
- computing a current-capacitance ratio indicating a ratio of the consumed current to the on-chip capacitance based on the estimated general values and the total amount of on-chip capacitance;
- performing placements of a primitive cell and a decoupling capacitance cell in each predetermined region of a plurality of predetermined regions obtained by dividing a placement region of the semiconductor integrated circuit, based on the current-capacitance ratio;
- estimating detail values of the consumed current and the on-chip capacitance of each of the predetermined regions by creating a lumped constant circuit model of each of the predetermined regions, based on a result of the placements of the primitive cell and the decoupling capacitance cell;
- conducting a detail power supply noise analysis based on the estimated detail values; and
- performing an adjustment of the placements of the primitive cell and the decoupling capacitance cell based on a result of the detail power supply noise analysis.

14. The designing method for a semiconductor integrated circuit according to claim 13, wherein the estimating general values includes estimating an entire consumed current as current consumed by the semiconductor integrated circuit in one clock period, and
wherein the estimating detail values includes estimating the consumed current of each of the predetermined regions as current consumed in one clock period in a corresponding one of the predetermined regions.

15. The designing method for a semiconductor integrated circuit according to claim 13, wherein the performing placement includes:
- computing a sum of current values of the primitive cells included in each of the predetermined regions;
- determining a decoupling capacitance based on the current-capacitance ratio and the sum of current values;
- determining a size of the decoupling capacitance cell having the decoupling capacitance; and
- performing a relocation of the primitive cells among the predetermined regions, if the decoupling capacitance cell having the determined size cannot be accommodated in a corresponding one of the predetermined regions.

16. The designing method for a semiconductor integrated circuit according to claim 13, wherein the computing the current-capacitance ratio includes creating the lumped constant circuit model of the semiconductor integrated circuit by:

simulating the on-chip capacitance of the entire semiconductor integrated circuit as a single capacitor;

simulating the power supply current flowing in the semiconductor integrated circuit as a single current source;

simulating wirings connected to the current source as a wiring model; and simulating a power supply terminal and a ground terminal of the semiconductor integrated circuit as a package board model.

17. The designing method for a semiconductor integrated circuit according to claim 16, wherein the computing the current-capacitance ratio further includes setting a waveform of a current value supplied from the current source so as to have a peak that is synchronous with a clock signal for operating the semiconductor integrated circuit.

18. The designing method for a semiconductor integrated circuit according to claim 16, wherein the computing the current-capacitance ratio includes setting a waveform of a current value supplied from the current source so as to comprise:

a first peak that is synchronous with one of a leading edge and a trailing edge of a clock signal for operating the semiconductor integrated circuit; and a second peak that is lower than the first peak and is synchronous with another one of the leading edge and the trailing edge of the clock signal.

19. The designing method for a semiconductor integrated circuit according to claim 13, wherein the lumped constant circuit model of each of the predetermined regions includes:

a regional current source that simulates a current consumed by the primitive cell included in the predetermined region;

a capacitor that simulates the on-chip capacitance distributed in the predetermined region; and a resistor that simulates a resistance of a wiring connected to a region neighboring the predetermined region, and wherein the semiconductor integrated circuit is modeled by a network to which the lumped constant circuit model of each of the predetermined regions is connected, and a package board model that simulates a power supply terminal and a ground terminal connected to the predetermined region.

* * * * *